(12) United States Patent
Numata

(10) Patent No.: US 10,834,339 B2
(45) Date of Patent: Nov. 10, 2020

(54) IMAGING APPARATUS, CONTROL METHOD FOR IMAGING APPARATUS, AND RECORDING MEDIUM

(71) Applicant: CANON KABUSHIKI KAISHA, Tokyo (JP)

(72) Inventor: Aihiko Numata, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/195,440

(22) Filed: Nov. 19, 2018

(65) Prior Publication Data

US 2019/0174075 A1    Jun. 6, 2019

(30) Foreign Application Priority Data

Dec. 4, 2017    (JP) ................. 2017-232848

(51) Int. Cl.
| | |
|---|---|
| *H04N 5/33* | (2006.01) |
| *H04N 9/04* | (2006.01) |
| *H04N 9/07* | (2006.01) |
| *H01L 27/146* | (2006.01) |

(52) U.S. Cl.
CPC ......... *H04N 5/33* (2013.01); *H01L 27/14621* (2013.01); *H01L 27/14645* (2013.01); *H04N 5/332* (2013.01); *H04N 9/04515* (2018.08); *H04N 9/07* (2013.01); *H01L 27/1461* (2013.01); *H01L 27/14627* (2013.01); *H01L 27/14636* (2013.01); *H01L 27/14649* (2013.01)

(58) Field of Classification Search
CPC ...... H04N 5/33; H04N 5/332; H04N 9/04515; H04N 9/07; H01L 27/14621; H01L 27/14645; H01L 27/1461; H01L 27/14627; H01L 27/14636; H01L 27/14649

See application file for complete search history.

(56) References Cited

U.S. PATENT DOCUMENTS

| 8,134,191 B2 * | 3/2012 | Yamaguchi | ............ H04N 5/33 |
| | | | 257/291 |
| 9,435,922 B2 * | 9/2016 | Choe | ............ G02B 5/201 |
| 2010/0123070 A1 * | 5/2010 | Natori | ............ H04N 9/07 |
| | | | 250/226 |

(Continued)

FOREIGN PATENT DOCUMENTS

JP    2000-59798 A    2/2000

*Primary Examiner* — Alexander Gee
(74) *Attorney, Agent, or Firm* — Canon U.S.A., Inc. IP Division

(57) ABSTRACT

An apparatus includes a solid-state imaging element including a first pixel and a second pixel, the first pixel being higher in sensitivity than the second pixel in a first wavelength range of visible light, the second pixel being higher in sensitivity than the first pixel in a second wavelength range of visible light, and further the first pixel being higher in sensitivity than the second pixel in a wavelength range of near-infrared light, a first cut filter provided on a light entry side of the solid-state imaging element and configured to cut visible light, and at least one processor or circuit configured to generate an image from pixel signals acquired by the solid-state imaging element, wherein the at least one processor or circuit determines a pixel signal to be used for generating the image, according to brightness of an object.

17 Claims, 12 Drawing Sheets

(56) References Cited

U.S. PATENT DOCUMENTS

| | | | |
|---|---|---|---|
| 2013/0314544 A1* | 11/2013 | Ban | H04N 5/33 348/164 |
| 2015/0281600 A1* | 10/2015 | Shigeta | H04N 9/045 348/77 |
| 2017/0294467 A1* | 10/2017 | Tamiya | H01L 27/14605 |

* cited by examiner

FIRST IMAGE CAPTURING MODE

SECOND IMAGE CAPTURING MODE

FIG.4A
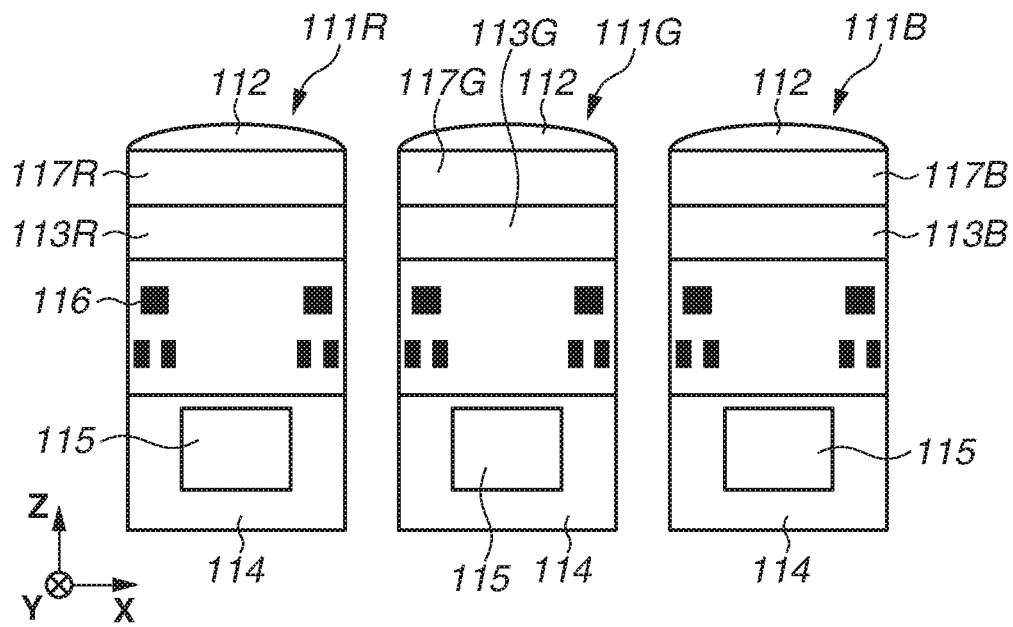
FIG.4B
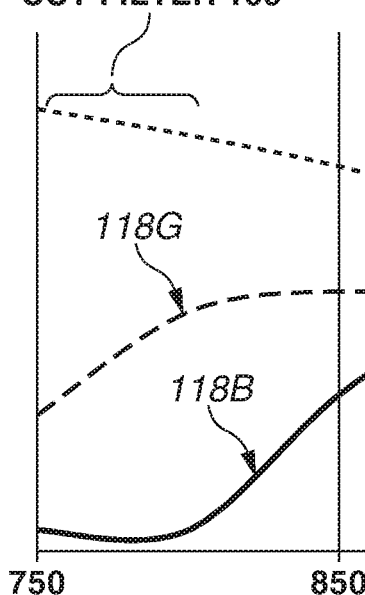
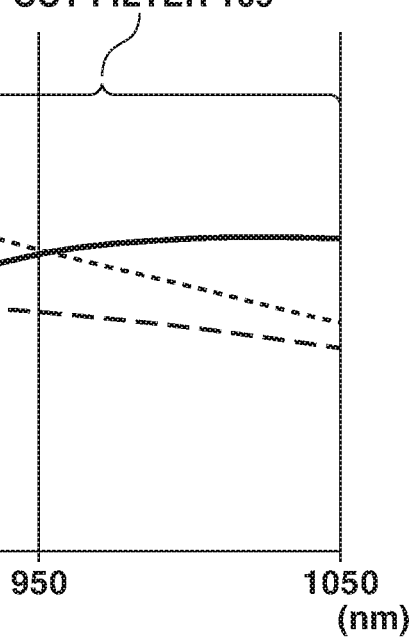

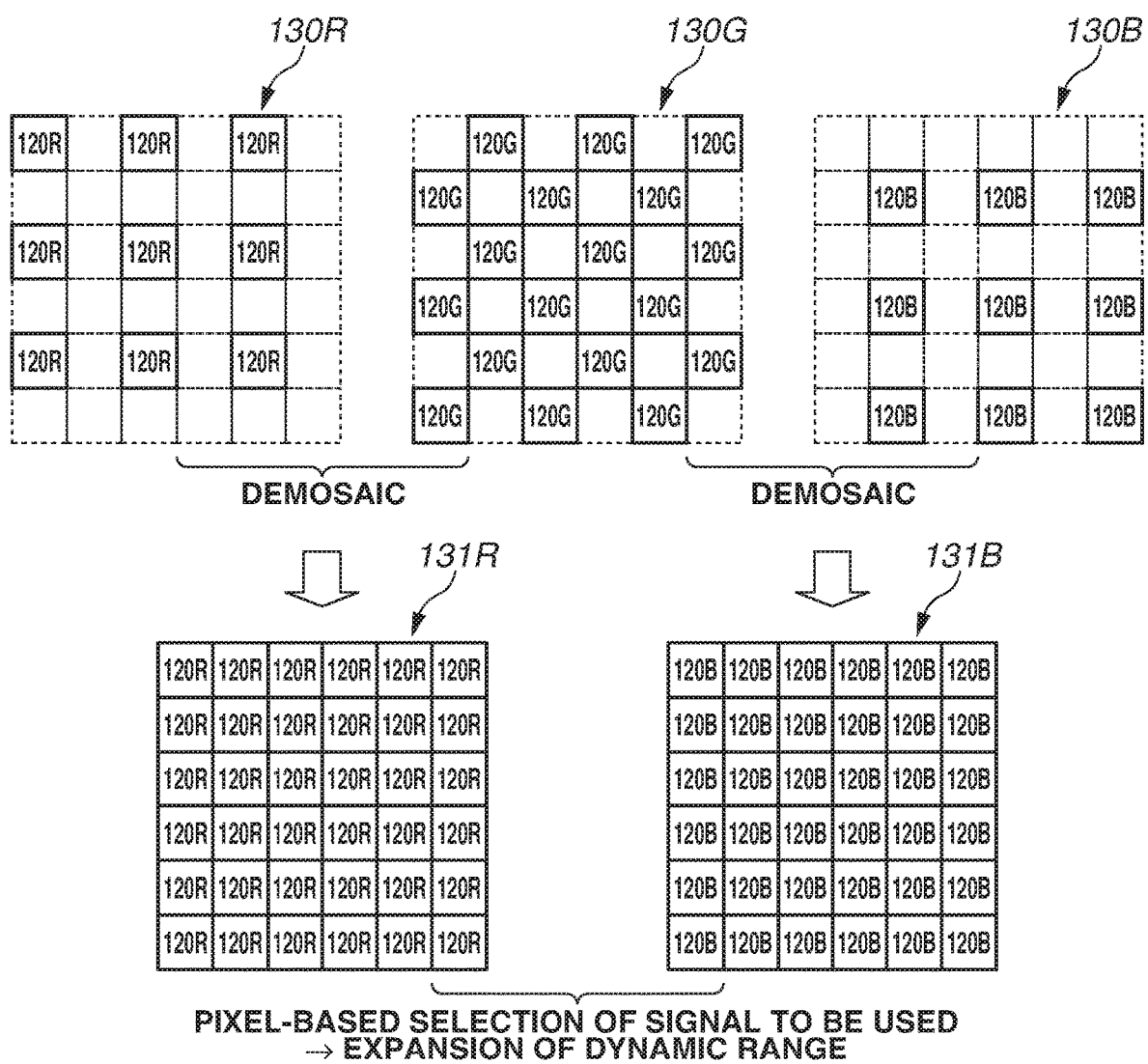

FIG.10A

| 120R | | 120R | | 120R | |
|---|---|---|---|---|---|
| | 120B | | 120B | | 120B |
| 120R | | 120R | | 120R | |
| | 120B | | 120B | | 120B |
| 120R | | 120R | | 120R | |
| | 120B | | 120B | | 120B |

FIG.10B

| | 120G | | 120G | | 120G |
|---|---|---|---|---|---|
| 120G | | 120G | | 120G | |
| | 120G | | 120G | | 120G |
| 120G | | 120G | | 120G | |
| | 120G | | 120G | | 120G |
| 120G | | 120G | | 120G | |

IMAGING APPARATUS, CONTROL METHOD FOR IMAGING APPARATUS, AND RECORDING MEDIUM

BACKGROUND OF THE INVENTION

Field of the Invention

The aspect of the embodiments relates to an imaging apparatus using a solid-state imaging element having sensitivity for visible light and near-infrared light, a control method for the imaging apparatus, and a recording medium.

Description of the Related Art

In recent years, there has been proposed an imaging apparatus that acquires an image captured with near-infrared light, by using a solid-state imaging element having sensitivity not only for visible light but also for near-infrared light. In general, near-infrared light, which has a longer wavelength, generates less dispersion caused by atmospheric smoke and fog than visible light generates. Thus, an object at a long distance can be captured clearer only with near-infrared light than only with visible light.

For example, Japanese Patent Application Laid-Open No. 2000-59798 discusses a technique in which a solid-state imaging element having sensitivity for both visible light and near-infrared light is used. Further, a visible light cut filter is provided for acquiring an image captured only with near-infrared light on a light entry side of the solid-state imaging element.

Above described technique makes it possible to acquire an image captured only with near-infrared light. However, there has been a growing demand for improvement in image quality of images captured only with near-infrared light, and a technique for further improvement of image quality has been demanded.

SUMMARY OF THE INVENTION

An apparatus includes a solid-state imaging element including a first pixel and a second pixel, the first pixel being higher in sensitivity than the second pixel in a first wavelength range of visible light, the second pixel being higher in sensitivity than the first pixel in a second wavelength range of visible light, and the first pixel being higher in sensitivity than the second pixel in a wavelength range of near-infrared light, a first cut filter provided on a light entry side of the solid-state imaging element and configured to cut visible light, and at least one processor or circuit configured to generate an image from pixel signals acquired by the solid-state imaging element, wherein the at least one processor or circuit determines a pixel signal to be used for generating the image, according to brightness of an object.

Further features of the disclosure will become apparent from the following description of exemplary embodiments with reference to the attached drawings.

BRIEF DESCRIPTION OF THE DRAWINGS

FIGS. 4A and 4B are diagrams illustrating a scheme for controlling a transmittance in a wavelength range of near-infrared light.

FIG. 9 is a diagram illustrating an expansion of dynamic range by a demosaic process.

FIGS. 10A and 10B are diagrams illustrating pixel positions of each color in a Bayer array.

DESCRIPTION OF THE EMBODIMENTS

Figure 1A:
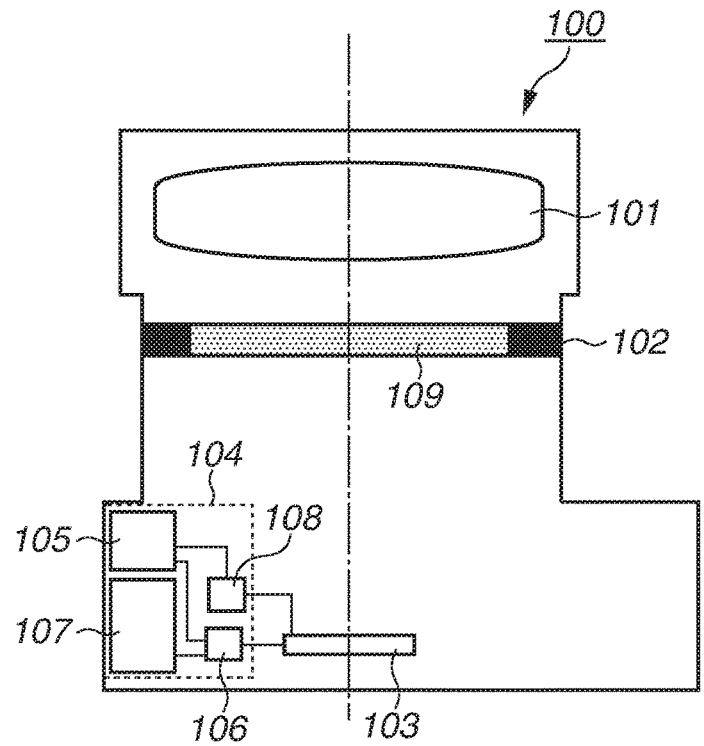
FIGS. 1A and 1B are diagrams each illustrating an internal configuration example of an imaging apparatus according to an exemplary embodiment.
Figure 1B:
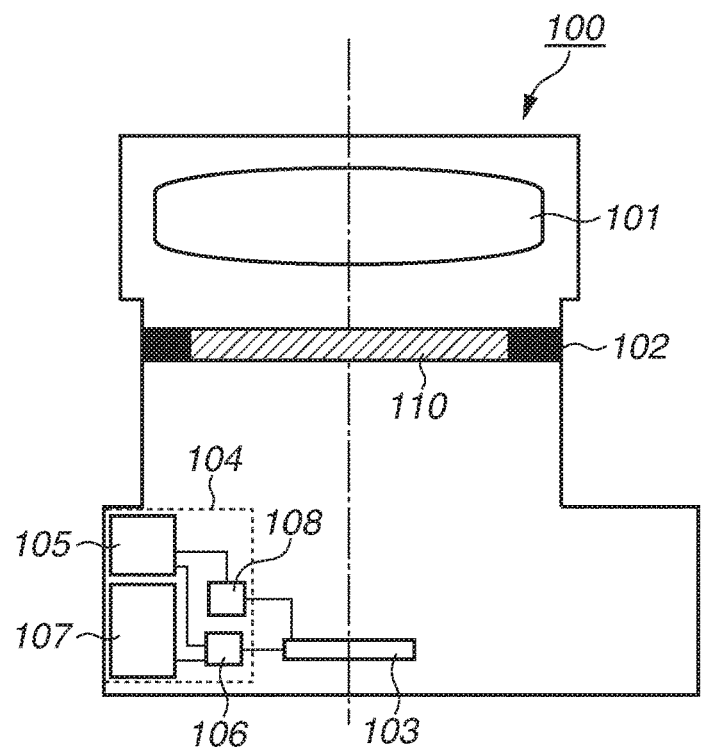

FIGS. 1A and 1B are diagrams each illustrating an internal configuration example of an imaging apparatus 100 according to a first exemplary embodiment.

In FIGS. 1A and 1B, the imaging apparatus 100 includes an image-forming optical system 101, a filter switching unit 102, a solid-state imaging element 103, and a control unit 104. The solid-state imaging element 103 is disposed on an optical axis of the image-forming optical system 101, and the image-forming optical system 101 forms an object image on the solid-state imaging element 103. The control unit 104 includes a central processing unit (CPU) 105, a transfer circuit 106, a calculation unit 107, and an element driving circuit 108.

The CPU 105 is a circuit for controlling the transfer circuit 106, the calculation unit 107, and the element driving circuit 108. The element driving circuit 108 is a circuit for driving the solid-state imaging element 103 in response to a signal from the CPU 105. The transfer circuit 106 stores a signal read out from the solid-state imaging element 103, and transfers the signal to the calculation unit 107. The calculation unit 107 performs image processing for a signal acquired via the transfer circuit 106.

The imaging apparatus 100 has a visible light cut filter 109 and a near-infrared light cut filter 110. The imaging apparatus 100 is configured to be capable of switching to a filter to be used by using the filter switching unit 102. Specifically, in a first image capturing mode, the imaging apparatus 100 acquires a captured image only with near-infrared light by a configuration illustrated in FIG. 1A. In a second image capturing mode, the imaging apparatus 100 acquires a captured image with only visible light by a configuration illustrated in FIG. 1B. The imaging apparatus 100 mounts the visible light cut filter 109 by using the filter switching unit 102 in the first image capturing mode. The imaging apparatus 100 mounts the near-infrared light cut filter 110 by using the filter switching unit 102 in the second image capturing mode.

<Solid-State Imaging Element>

Figure 2A:
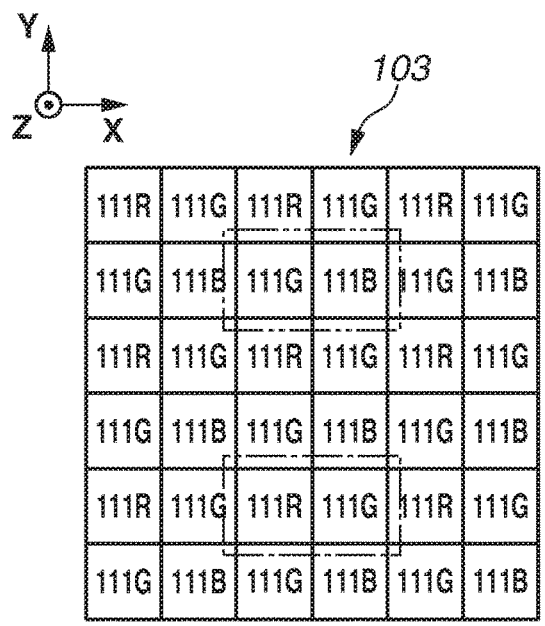
FIGS. 2A, 2B, and 2C are diagrams illustrating a configuration of a solid-state imaging element according to a first exemplary embodiment.
Figure 2B:
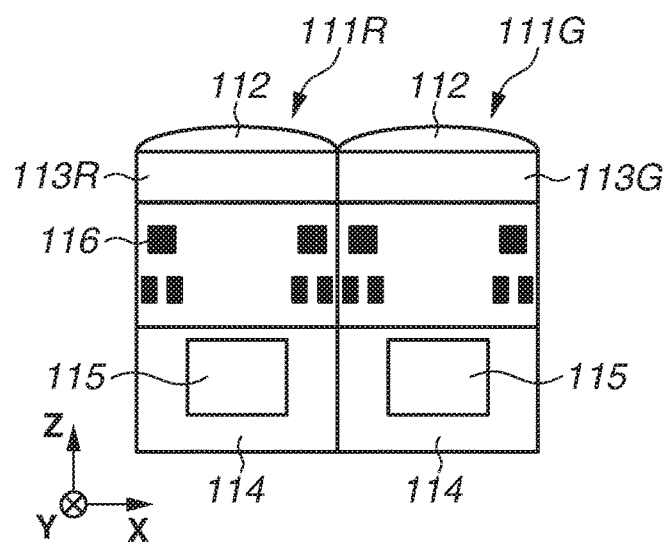
Figure 2C:
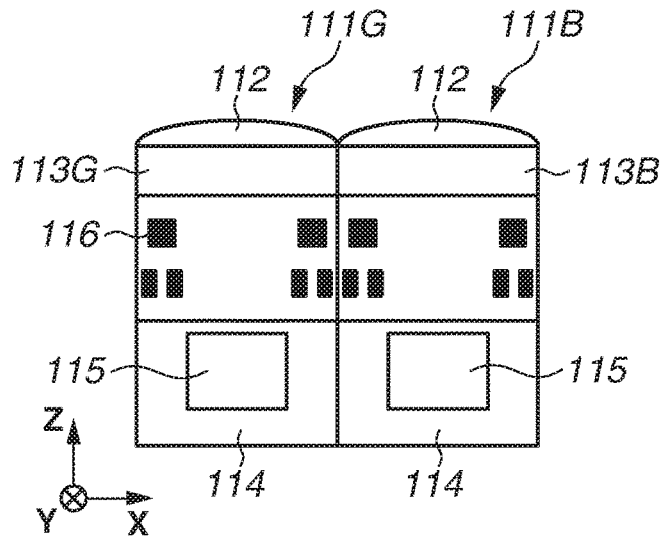

FIGS. 2A to 2C are diagrams illustrating a configuration of the solid-state imaging element 103. As illustrated in FIG. 2A, the solid-state imaging element 103 includes pixels 111R for detecting pixel signals for red light, pixels 111G for detecting pixel signals for green light, and pixels 111B for detecting pixel signals for blue light. Although in an example of FIG. 2A, a case where the number of pixels is 6×6 is illustrated, the number of pixels may be varied. Further, in the example of FIG. 2A, although the pixels 111R, 111G, and 111B are arranged in a so-called Bayer array, it may not be necessarily required. In the description below, in a case where a component of a pixel 111R for red color, a pixel 111G for green color, or a pixel 111B for blue color has respective configuration of element, each element is distinguished by a character of a R, G, or B respectively. On the other hand, in a case where a component of a pixel 111R for red color, a pixel 111G for green color, or a pixel 111B for blue color has a common configuration of element, the character of R, G, or B is omitted.

FIG. 2B is a cross-sectional diagram of a main part of the two pixels 111R and 111G, which is enclosed by an alternate long and short dash line in FIG. 2A. FIG. 2C is a cross-sectional diagram of a main part of the two pixels 111G and 111B, which is enclosed by an alternate long and two short dashes line in FIG. 2A. Each of the pixels 111 has a micro lens 112, a color filter 113, and a substrate 114, which are arranged from the light entry side. The micro lens 112 is transparent in visible light and near-infrared light, and is formed of an inorganic material such as silicon di-oxide ($SiO_2$) or silicon nitride (SiN), or an organic material such as resin. The substrate 114 is formed of a material of an inorganic semiconductor such as Si, an oxide semiconductor such as indium gallium zinc oxygen (InGaZnO), or an organic semiconductor, which absorbs at least a part of visible light and at least a part of near-infrared light. Here, "absorb" means that an extinction coefficient equals $1 \times 10^{-3}$ or more, in a desired wavelength range.

Here, visible light refers to the light with wavelength of 380 nm or longer and shorter than 750 nm, and near-infrared light refers to the light with wavelength of 750 nm or longer and 2500 nm or shorter. In a case where silicon is used as the material of the substrate 114, the material absorbs the light of the entire wavelength range of visible light, and the light with wavelengths of 750 nm or longer and 1100 nm or shorter in near-infrared light, because silicon has an absorption edge of 1100 nm.

In the substrate 114 of each pixel 111, a photoelectric conversion unit 115, which is doped with an impurity by ion implantation, is formed. Light enters into each of the pixels and the light is photoelectrically converted within the substrate 114. Electric charge is collected within the photoelectric conversion unit 115. First, light arrives at the substrate 114 and is photoelectrically converted within the substrate 114, and electric charge is collected in the photoelectric conversion unit 115. Here an efficiency of this process is defined as a "photoelectric collection rate". The electric charge collected in the photoelectric conversion unit 115 is read out through a wiring line 116 formed of metal such as Al or Cu, and then the electric charge is transferred to the transfer circuit 106. In FIGS. 2A, 2B, and 2C, an example in which the wiring line 116 is provided on the light entry side of the substrate 114. However, the wiring line 116 may be provided on the other side of the substrate 114 with respect to the light entry side.

<Color Filter Characteristics in Visible Light Band>

The pixel 111R is provided with a color filter 113R that selectively transmit red light therethrough in the wavelength range of visible light. Similarly, the pixel 111G is provided with a color filter 113G that selectively transmit green light therethrough, and the pixel 111B is provided with a color filter 113B that selectively transmit blue light therethrough.

Figure 3A:
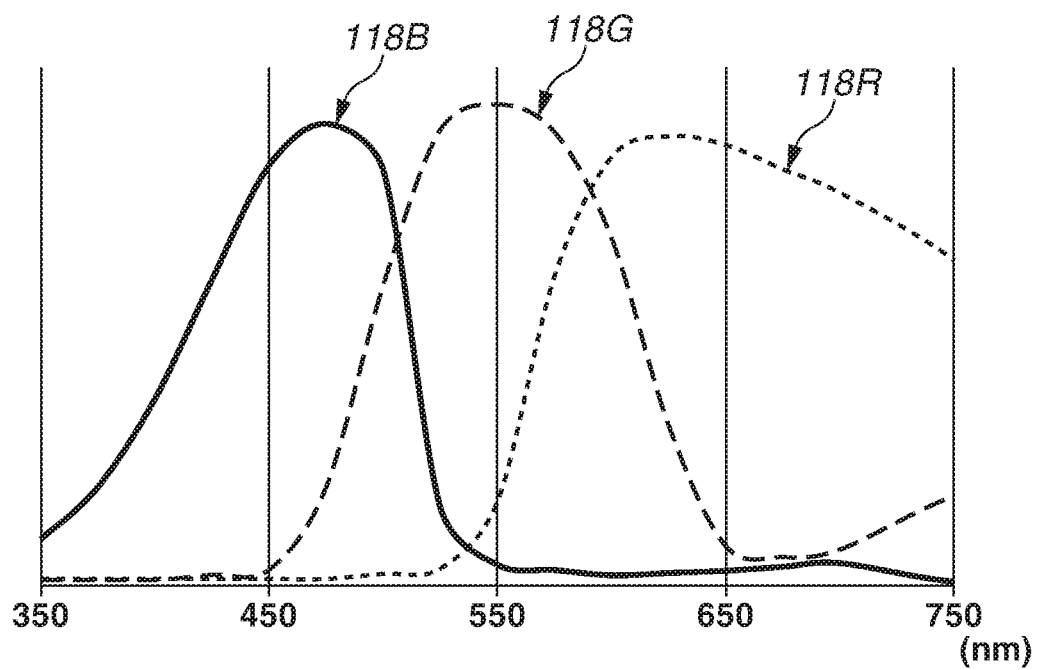
FIGS. 3A and 3B are graphs illustrating a relationship between a wavelength and each pixel in a wavelength range from visible light to near-infrared light.
Figure 3B:
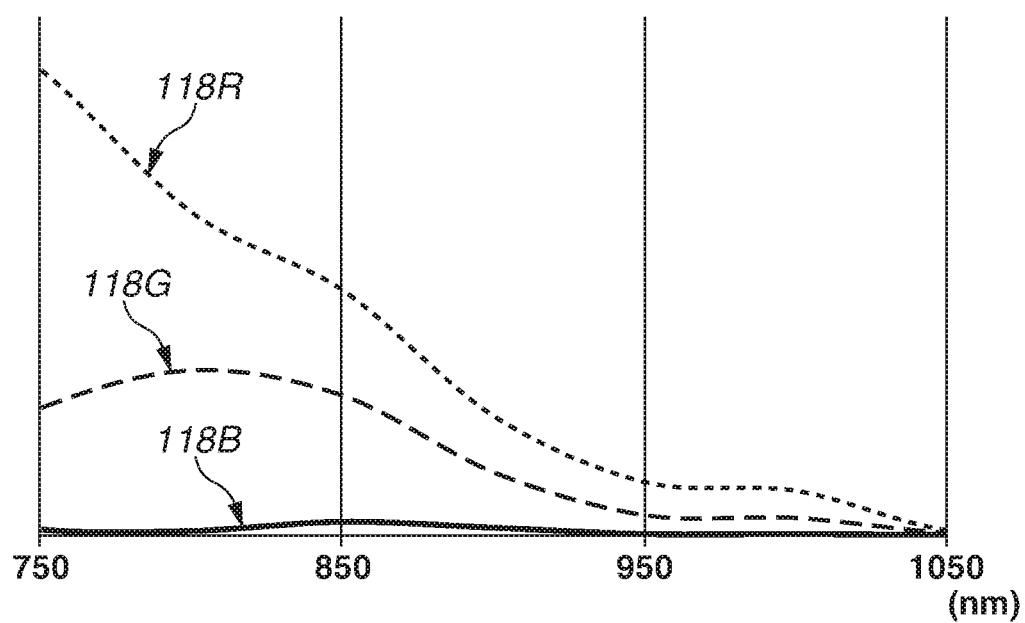

FIGS. 3A and 3B illustrate a sensitivity 118 of each of the pixels. In FIGS. 3A and 3B, a horizontal axis indicates wavelength (unit; nm), and a vertical axis indicates sensitivity. The sensitivity 118 is proportional to the product of the transmittance of the color filter 113 and the photoelectric collection rate of the photoelectric conversion unit 115.

As illustrated in FIG. 3A, the pixel 111R for red color has a high sensitivity to red light with a wavelength of 600 nm or longer (118R). Further, the pixel 111G for green color has a high sensitivity to green light with a wavelength of 500 nm or longer and 600 nm or shorter (118G), and the pixel 111B for blue color has a high sensitivity to green light with a wavelength of 500 nm or shorter (118B). In this way, the pixels 111R, 111G, and 111B are provided with the respective color filters 113 that vary in transmission spectrum in the wavelength range of visible light. Therefore, color information of an object can be acquired in the second image capturing mode.

<Color Filter Characteristics in Near-Infrared Light Band>

Further, the color filters 113R, 113G, and 113B used in the present exemplary embodiment also vary in transmittance in the wavelength range of near-infrared light. Specifically, in the wavelength range of near-infrared light, the transmittances of the color filters 113 satisfy a magnitude relationship of R>G>B. As described above, the sensitivity of the pixel is proportional to the product of the transmittance of the color filter and the photoelectric collection rate of the photoelectric conversion unit. Thus, as illustrated in FIG. 3B, the sensitivities 118 satisfy the magnitude relationship of R>G>B, in the wavelength range of near-infrared light. In other words, a plurality of types of pixel signals varying in sensitivity can be acquired in the first image capturing mode using the configuration of the present exemplary embodiment. The dynamic range of the captured image acquired in the first image capturing mode can be expanded by acquiring the plurality of types of pixel signal of respective sensitivity. A specific method for expanding the dynamic range will be described below.

The sensitivities 118 may not satisfy the magnitude relationship of R>G>B in all the wavelength range of near-infrared light. The magnitude relationship of R>G>B may only be satisfied with respect to an integral value of the sensitivity 118 within the wavelength range of near-infrared light. The integration range of the sensitivity 118 is a wavelength range of light passing through the visible light cut filter 109.

<Characteristic Control Method in Near-Infrared Light Band of Color Filter>

For a scheme for controlling a transmittance in the wavelength range of near-infrared light of each color filter, one scheme may be selected from or a plurality of schemes may be combined from the following schemes. In one embodiment, a method for controlling only a transmittance in the wavelength range of near-infrared light is adopted, while reducing an influence to be exerted on a transmittance in the wavelength range of visible light. The reason is that, if the transmittance of the color filter in the wavelength range of visible light is changed, this may lead to a decline in reproducibility of an object in acquisition of a captured image in the second image capturing mode.

<Containing Pigment>

A first scheme is a scheme for making each of the color filters contain an absorbent material with absorption characteristics in the wavelength range of near-infrared light, and varying the density of the absorbent material for each color of filters. Specifically, the density of the absorbent material in the color filter 113B may be higher than that in the color filter 113G, and the density of the absorbent material in the color filter 113G may be higher than that in the color filter 113R. For the absorbent material, a material such as a pigment based on diimmonium or phthalocyanine may be used. These materials have absorption characteristics in the wavelength range of near-infrared light, and a high transmittance in the wavelength range of visible light. The solid-state imaging element 103 illustrated in FIGS. 2A, 2B, and 2C has a configuration adopting the first scheme.

<Double-Layer Configuration>

A second scheme is a method for providing the color filter with a double-layer configuration as illustrated in FIG. 4A. Specifically, this is a method for providing each of the pixels with a color filter 113 that allows only a specific light of color to pass therethrough in the wavelength range of visible light, and a filter layer 117 that absorbs or reflects near-infrared light. The transmittance in the wavelength range of near-infrared light may be controlled by changing the configuration of the filter layer 117 for each of the pixels.

The filter layer 117 may be formed of the above-described pigment based on diimmonium or phthalocyanine. The transmittance in the wavelength range of near-infrared light may be controlled based on the density of the pigment in the filter layer 117, or may be controlled based on the thickness of the filter layer 117. In a case where the control is performed based on the density of the pigment, the density of the pigment in a filter layer 117B may be higher than that in a filter layer 117G, and the density of the pigment in the filter layer 117G may be higher than that in a filter layer 117R. In a case where the control is performed based on the thickness of the filter, the thickness of the filter layer 117B may be larger than that of the filter layer 117G, and the thickness of the filter layer 117G may be larger than that of the filter layer 117R. Here, the density and the thickness may include a case of zero. In other words, the filter layer 117R may not be provided.

Instead of controlling the transmittance based on the characteristics of the material of the filter layer 117, the transmittance may be controlled based on a structure provided in the filter layer 117. Specifically, a periodic structure such as a multilayer film or a photonic crystal may be used. Alternatively, a metal microstructure such as minute particles or a split ring resonator may be used. By controlling the period of the periodic structure or the size of the metal microstructure, it is possible to control the transmittance in the wavelength range of near-infrared light while maintaining a transmittance in high level in the wavelength range of visible light.

<Control Using Visible Light Cut Filter>

A third scheme is a method for performing control based on the characteristics of the visible light cut filter 109. As illustrated in FIG. 4B, a case will be described where the magnitude relationship between the sensitivities 118 changes in the wavelength range of near-infrared light. In this case, it is possible to control the magnitude relationship between the integral values of the sensitivities, by controlling the wavelength range of light passing through the visible light cut filter 109. For example, in a case where the wavelength range of the light passing through the visible light cut filter 109 coincides a transmission range A in FIG. 4B, the differences between the integral values of the sensitivities 118 of R, G, and B are small. On the other hand, in a case where the wavelength range of light passing through the visible light cut filter 109 coincides a transmission range B in FIG. 4B, the differences between the integral values of the sensitivities 118 of R, G, and B are large. In this way, it is also possible to control the sensitivities 118 of the pixels 111R, 111G, and 111B, by controlling the wavelength range of the light passing through the visible light cut filter 109.

<Method for Expanding Dynamic Range>

Figure 5:
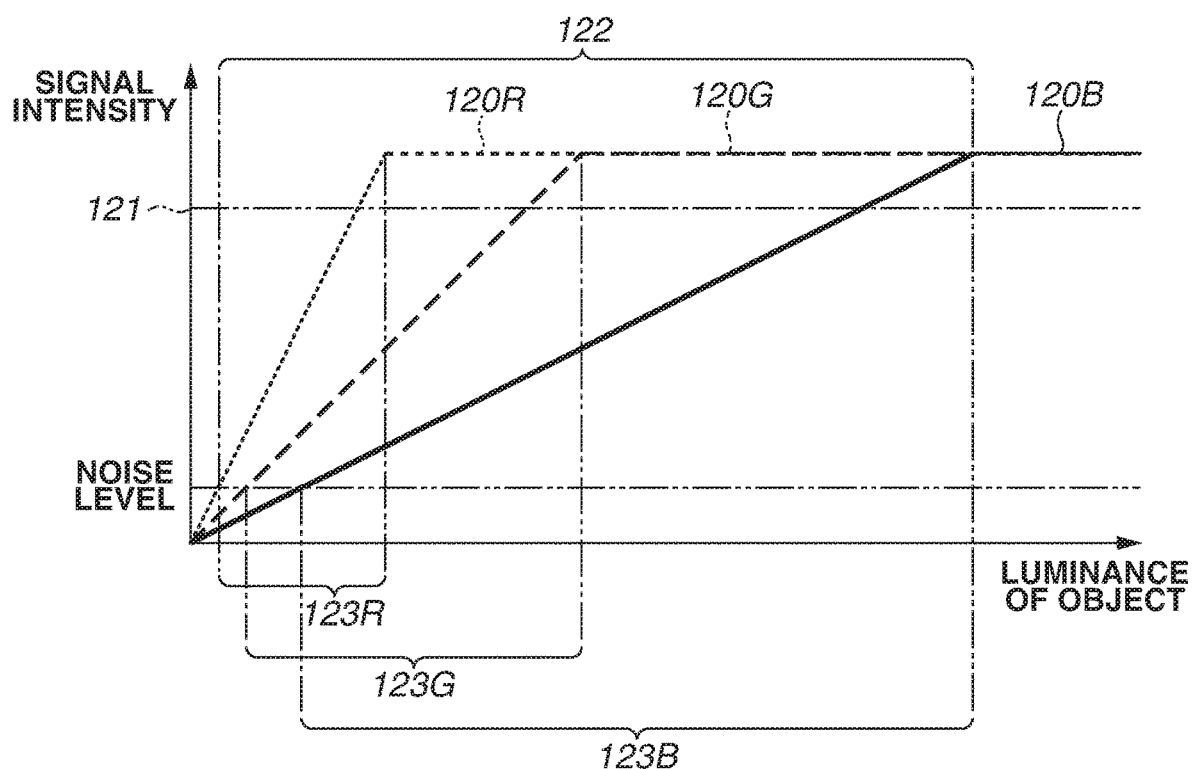
FIG. 5 is a diagram illustrating a method for expanding a dynamic range.

Here, a method for expanding the dynamic range of a captured image by using a plurality of types of pixel signal varying in sensitivity will be described with reference to FIG. 5. FIG. 5 is a diagram illustrating the level of the luminance of an object, and the intensity of each of pixel signals 120R, 120G, and 120B acquired by the pixels 111R, 111G, and 111B, respectively, in the first image capturing mode. In a case where an image of an object of the same luminance is captured, the magnitude relationship between the intensities of the pixel signals is R>G>B, because of the differences between sensitivities in the wavelength range of near-infrared light. Therefore, by switching to a pixel signal to be used based on the luminance of the object, the calculation unit 107 can expand the dynamic range of the captured image.

Specifically, the following may be performed. In a case where the intensity of the pixel signal 120R is shorter than a predetermined threshold 121, the calculation unit 107 uses the pixel signal 120R. In a case where the intensity of the pixel signal 120R is equal to or more than the predetermined threshold 121, the calculation unit 107 uses the pixel signal 120B. Here, the predetermined threshold 121 is a value smaller than the signal intensity when the pixel signal 120 is saturated.

Thus, in the case where switching to the pixel signal to be used is performed based on the luminance of the object, the dynamic range of the captured image is within a range 122 in FIG. 5. On the other hand, in a case where only the pixel signal 120R, 123G, or 123B is used, a dynamic range is within a range 123R, 123G, or 123B respectively. In this way, switching to the pixel signal to be used is performed based on the luminance of the object, and thereby the dynamic range of the captured image is expanded.

<Using of Three or More Types of Pixel Signal>

For a method for expanding the dynamic range of the captured image, three or more types of pixel signal may be used. Specifically, in a case where the intensity of the pixel signal 120R is less than the predetermined threshold 121, the calculation unit 107 uses the pixel signal 120R. In a case where the intensity of the pixel signal 120R is equal to or more than the predetermined threshold 121 and the intensity of the pixel signal 120G is less than the predetermined threshold 121, the calculation unit 107 uses the pixel signal 120G. In a case where the intensity of the pixel signal 120G is equal to or more than the predetermined threshold 121, the calculation unit 107 uses the pixel signal 120B. In this way, three types of pixel signal may be used. When the number of types of used pixel signal is greater, a decline of signal-to-noise (SN) ratio is suppressed when switching the pixel signal to be used around the threshold level. In general, the SN ratio declines more significantly, if the intensity ratio between pixel signals to be switched exceeds 100. Thus, in a case where the signal intensity ratio between the pixel signal 120R and the pixel signal 120B exceeds 100, the pixel signal 120G as a signal with middle sensitivity may be used.

<Middle Range of Sensitivity>

In a case where the pixel signal 120G is used as the signal with middle range of sensitivity, the sensitivity ratio between the pixel signal 120R and the pixel signal 120G and the sensitivity ratio between the pixel signal 120G and the pixel signal 120B are, desirably, as equal as possible. This suppresses a decline in SN ratio when a pixel signal is switched. Specifically, in one embodiment, the following relation be satisfied among sensitivities 118R, 118G, and 118B.

$$0.1 \leq 118R \times 118B \div 118G^2 \leq 10 \quad (1)$$

In other words, the ratio of the product of the sensitivity 118R and the sensitivity 118B to the square of the sensitivity 118G may be 0.1 or more and 10 or less.

<Summary>

In the imaging apparatus according to the present exemplary embodiment, the transmittance of a color filter for acquiring the color information of an object in the wavelength range of visible light is also different from those of other color filters, in the wavelength range of near-infrared light. Providing such a configuration allows acquisition of a plurality of types of pixel signal varying in sensitivity, in the image capturing mode for acquiring a captured image only with near-infrared light. Further, it is possible to expand the dynamic range of the captured image only with near-infrared light, by switching to a pixel signal to be used, based on the luminance of an object. Switching to the pixel signal to be used may be performed depending on a field angle or a frame.

Further, the wavelength of the captured image to be acquired in the first image capturing mode and that in the second image capturing mode are different. Thus, the transmittance of the color filter most suitable for the first image capturing mode and the transmittance of the color filter most suitable for the second image capturing mode can be obtained. In other words, in the imaging apparatus according to the present exemplary embodiment, the quality of the captured image only with near-infrared light can be improved without degradation in the quality of the captured image only with visible light.

<Higher Transmittance at Wavelength Closer to Near-Infrared Light>

Although the magnitude relationship between the sensitivities 118 in the wavelength range of near-infrared light is in the order of R>G>B in the example illustrated in FIG. 3B, the magnitude relationship may be different. However, in a case where a transmitted wavelength in the wavelength range of visible light and a wavelength of near-infrared light are close to each other, it is difficult to reduce the transmittance in the wavelength range of near-infrared light, without lowering the transmittance in the wavelength range of visible light. Therefore, as illustrated in FIGS. 3A and 3B, a configuration in which the closer the transmission wavelength in the wavelength range of visible light to the wavelength of the near-infrared light is, the higher the sensitivity 118 is is adopted.

<Varying Transmittances in Near-Infrared Light Range Between Gr and Gb>

FIGS. 2A, 2B, and 2C illustrate the case where the three types of pixel having the three types of color filters of red, green, and blue are provided in the solid-state imaging element 103. However, the number of the types of pixel may be two or more.

As described above, when the number of pixel signals varying in sensitivity is larger, the decline in SN ratio when switching to the pixel signal to be used around the threshold is more suppressed. Therefore, the color filters having the same transmittance characteristics in the wavelength range of visible light may have different transmittances in the wavelength range of near-infrared light.

Figure 6A:
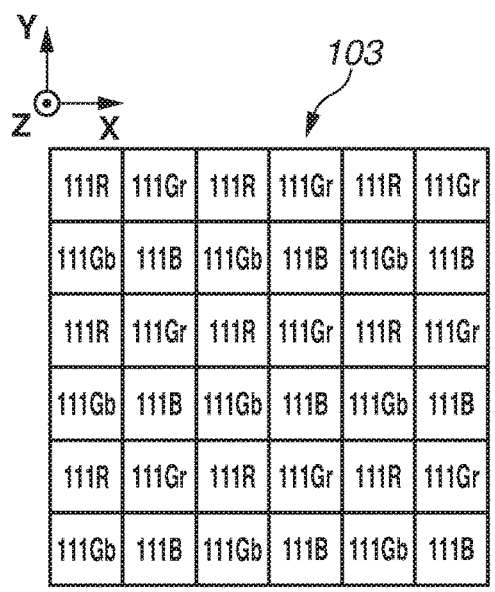
FIGS. 6A, 6B, and 6C are diagrams illustrating an example in which transmittance in a wavelength range of near-infrared light varies between a green pixel adjacent to a red pixel in an X direction and a green pixel adjacent to a blue pixel in the X direction.
Figure 6B:
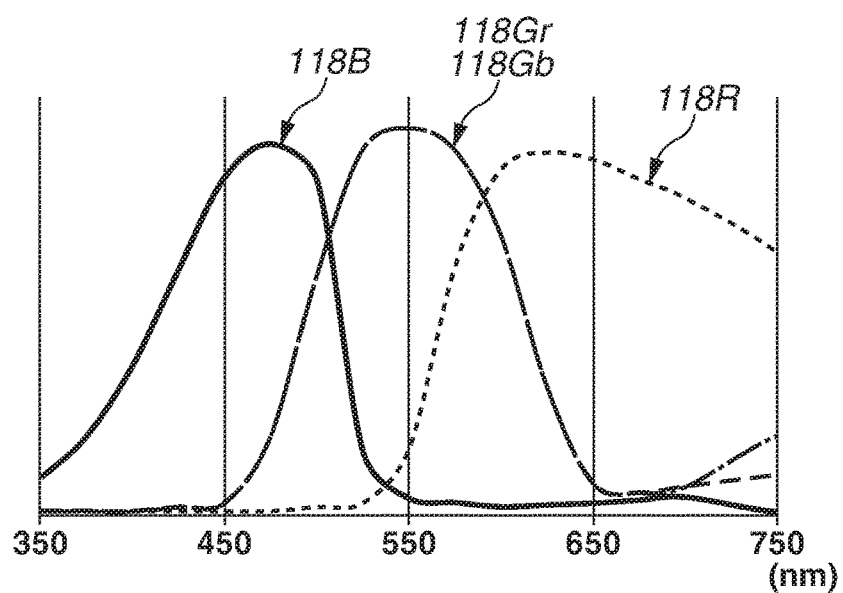
Figure 6C:
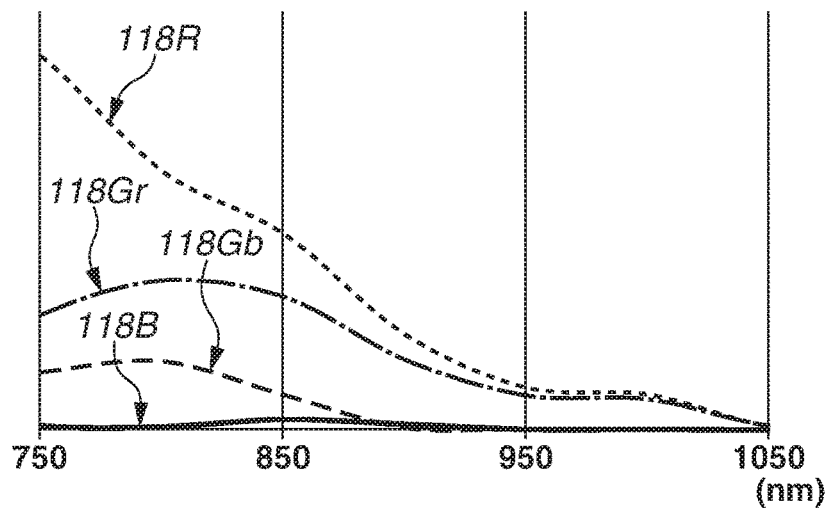

FIGS. 6A, 6B, and 6C are diagrams illustrating an example in which transmittances in the wavelength range of near-infrared light vary between a pixel 111Gr for green color adjacent to the pixel 111R for red color in the X direction and a pixel 111Gb for green color adjacent to the pixel 111B for blue color in the X direction. FIG. 6A illustrates a pixel arrangement in this example. FIG. 6B and FIG. 6C illustrate sensitivities in the wavelength range of visible light and sensitivities in the wavelength range of near-infrared light, respectively. Providing such a configuration allows suppression of a decline in SN ratio in pixel signal switching in the first image capturing mode, while acquiring color information of an object by using pixel signals arranged in the Bayer array in the second image capturing mode. Therefore, such a configuration is provided. FIG. 6C illustrates a case where the sensitivity of the pixel 111Gr for green color is higher than the sensitivity of the pixel 111Gb for green color in the wavelength range of near-infrared light. However, the magnitude relationship between the sensitivities of the respective pixels 111Gr and 111Gb for green color may be reversed.

Figure 7A:
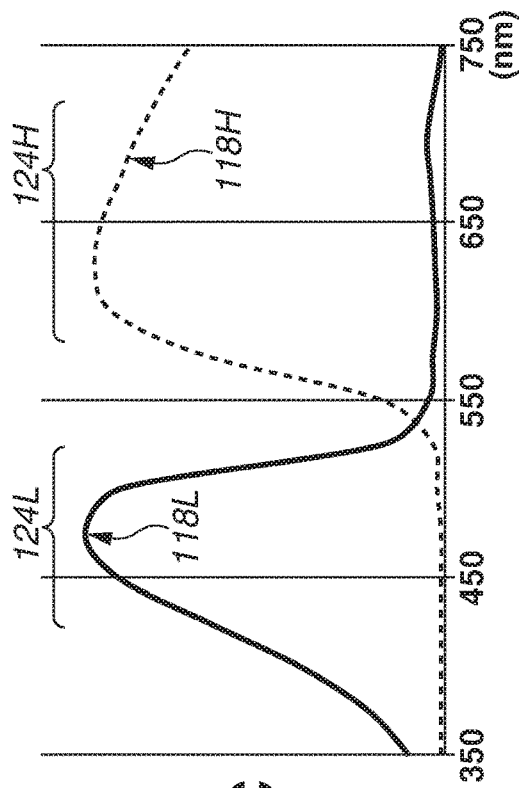
FIGS. 7A, 7B, 7C, and 7D are diagrams illustrating a case where two types of color filter are adopted.
Figure 7B:
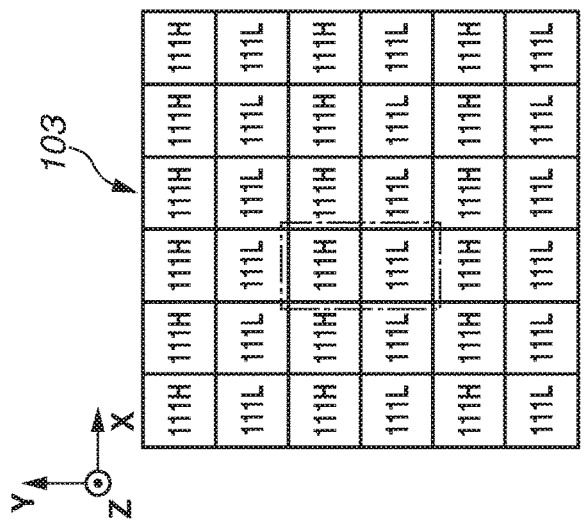
Figure 7C:
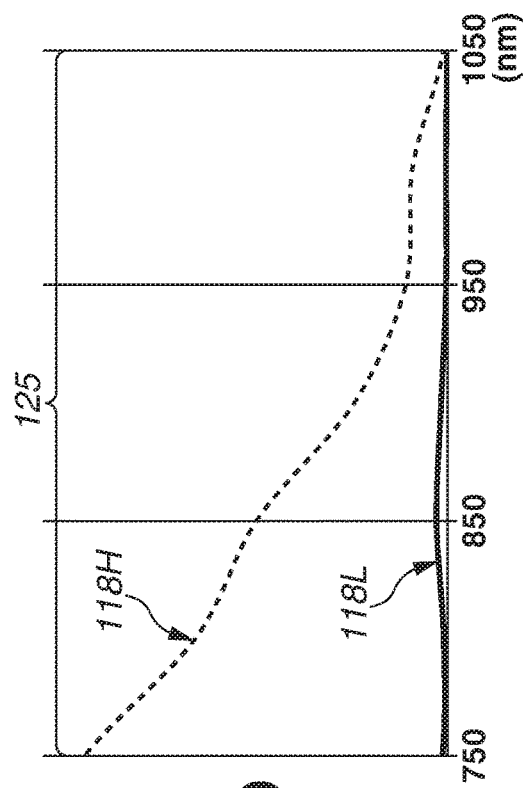
Figure 7D:
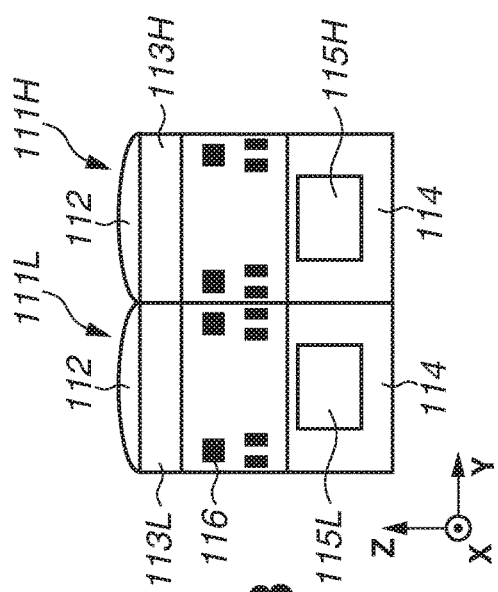

FIGS. 7A, 7B, 7C, and 7D are diagrams illustrating a case where two types of color filter are adopted, as the simplest configuration. FIG. 7A and FIG. 7B illustrate a configuration of a solid-state imaging element in this example. FIG. 7C and FIG. 7D illustrate the sensitivity of each pixel in the wavelength range of visible light, and the sensitivity of each pixel in the wavelength range of near-infrared light, respectively.

In the example illustrated in FIGS. 7A to 7D, the configuration of the imaging apparatus 100 according to the present exemplary embodiment is as follows. The solid-state imaging element 103 has two types of pixel, which are a first pixel 111H and a second pixel 111L. The first pixel 111H and the second pixel 111L include a color filter 113L and a color filter 113H, respectively. Light entering the first pixel 111H and light entering the second pixel 111L are collected in a photoelectric conversion unit 115L and a photoelectric conversion unit 115H, respectively.

Further, as illustrated in FIG. 7C and FIG. 7D, a sensitivity 118H of the first pixel 111H in a first wavelength range 124H is higher than the sensitivity 118H of the first pixel 111H in a second wavelength range 124L. Further, a sensitivity 118L of the second pixel 111L in the second wavelength range 124L is higher than the sensitivity 118L of the second pixel 111L in the first wavelength range 124H. Furthermore, in a third wavelength range 125, the sensitivity 118H of the first pixel 111H is higher than the sensitivity 118L of the second pixel 111L.

In the first image capturing mode, a third color filter (the visible light cut filter 109) that absorbs light in the first wavelength range and the second wavelength range is mounted on the light entry side of the solid-state imaging element. In the first image capturing mode, in a case where the intensity of a pixel signal acquired by the first pixel 111H is less than a predetermined threshold, the pixel signal acquired by the first pixel 111H is used. In a case where the intensity of a pixel signal acquired by the first pixel 111H is equal to or higher than the predetermined threshold, a pixel signal acquired by the second pixel 111L is used. Thus, the dynamic range of a captured image only with near-infrared light can be expanded by combining these pixel signals.

When the ratio of the sensitivity of the first pixel 111H to the sensitivity of the second pixel 111L in the wavelength range of near-infrared light is larger, the dynamic range of the captured image only with near-infrared light can be expanded more. In one embodiment, the sensitivity ratio is 2 or more, and yet in another embodiment, the sensitivity ratio is 10 or more.

A second exemplary embodiment of the disclosure will be described below. An imaging apparatus according to the present exemplary embodiment has a characteristic in an image processing method for a captured image to be acquired in the first image capturing mode. In the present exemplary embodiment, a solid-state imaging element has a pixel array similar to the Bayer array illustrated in FIG. 2A. The present exemplary embodiment is particularly effective in a case where sensitivities in the wavelength range of near-infrared light have a magnitude relationship of R>G>B similar to the magnitude relationship illustrated in FIGS. 3A and 3B.

Figure 8A:
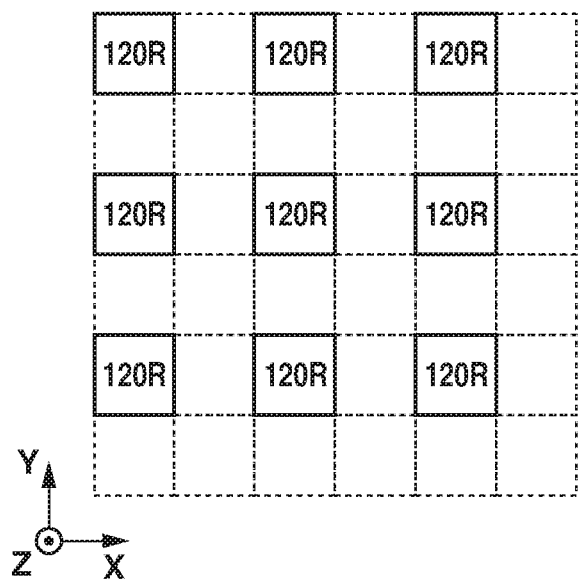
FIGS. 8A, 8B, and 8C are diagrams each illustrating pixel positions of a color in a Bayer array.
Figure 8B:
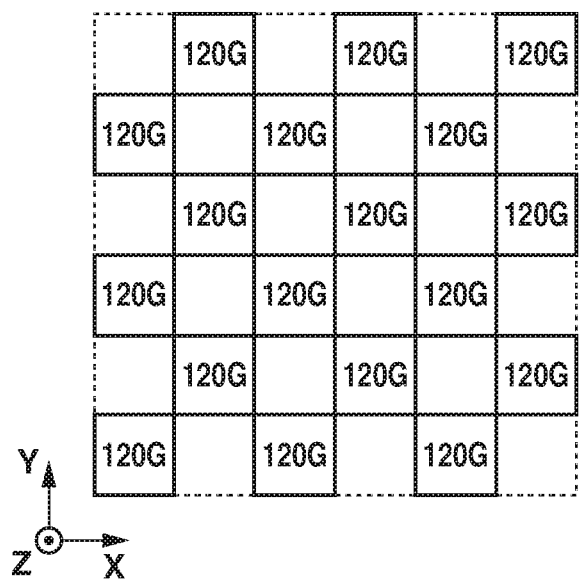
Figure 8C:
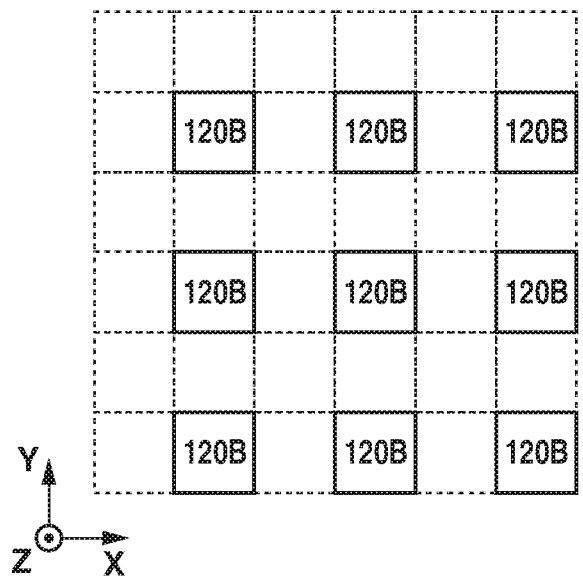

FIGS. 8A, 8B, and 8C are diagrams illustrating sampling positions of the pixel signals 120R, 120G, and 120B acquired in the first image capturing mode. FIG. 8A illustrates the pixel signal 120R with high sensitivity acquired by the pixel 111R. FIG. 8B illustrates the pixel signal 120G with middle sensitivity acquired by the pixel 111G. FIG. 8C illustrates the pixel signal 120B with low sensitivity acquired by the pixel 111B. As illustrated in FIGS. 8A to 8C, a sampling pitch of the pixel signal 120G with middle sensitivity is smaller than a sampling pitch of each of the pixel signal 120R with high sensitivity and the pixel signal 120B with low sensitivity, reflecting the Bayer array.

FIG. 9 is a diagram illustrating the image processing method in the present exemplary embodiment. First, from an image 130R based on the pixel signal 120R with high sensitivity and large sampling pitch, an image 131R with small sampling pitch is generated by interpolation processing. At this time, a demosaic process is performed using an image 130G, as a guide image, with smaller sampling pitch than that of the image 130R. Similarly, an image 131B with small sampling pitch is generated by a demosaic process, using an image 130B with large sampling pitch as a base image, and the image 130G with small sampling pitch as a guide image.

Afterward, in a case where the intensity of a pixel signal at each position of the image 131R with small sampling pitch is less than a predetermined threshold, the pixel signal 120R of the image 131R is used. In a case where this intensity is equal to or more than the threshold, the pixel signal 120B of the image 131B is used. Thus, an image having an expanded dynamic range is generated. In the second exemplary embodiment, the pixel signal to be used is selected after the images 131R and 131B with small sampling pitches are generated. Therefore, it is possible to acquire a high-resolution image while expanding a dynamic range.

Specifically, the following processing is performed. First, a temporary pixel value is calculated for an empty position of the image 130R (130B) by interpolation of a typical scheme such as a bi-liner method or a bi-cubic method, by using only the pixel signal 120R (120B). Then, the pixel signal 120G for the empty position of the image 130R (130B) is divided by the average value of surrounding pixel signals (e.g., 15×15 pixels), and a standardization signal is calculated. Next, the temporary pixel value is corrected using the average value of the surrounding pixel signals and the standardization signal described above, and a final pixel signal for the empty position of the image 130R (130B) is calculated by the following formulas.

(Final pixel signal of $R$)=(Temporary pixel value of $R$)×$C$×(Standardization signal of $G$)  (2)

(Final pixel signal of $B$)=(Temporary pixel value of $B$)×$C$×(Standardization signal of $G$)  (3)

Here, C is a correction coefficient of 0 or more and less than 1, and may be set to an appropriate value based on the value of each of the pixel signals 120R, 120G, and 120B. For example, when a difference between the pixel signals 120R, 120G, or 120B and the average value of the surrounding pixel signals for the standardization signal is large, the correction coefficient C may be small to reduce a correction effect.

In this way, in the present exemplary embodiment, when the image 131R (131B) with small sampling pitch is generated from the image 130R (130B) with large sampling pitch, information of the image 130G with small sampling pitch is used. Thus, the accuracy of the demosaic process is more improved than in a case where interpolation processing is performed using only the image 130R (130B). Then, a demosaic image (the images 131R and 131B) with high accuracy can be acquired. Therefore, it is possible to achieve not only the expansion of the dynamic range of the image acquired in the first image capturing mode, but also an improvement in resolution.

In the example described above, the standardization signal is calculated by dividing by the average value of the surrounding pixel signals. However, the standardization signal may be calculated by dividing by the median value of the surrounding pixel signals, or may be calculated by fitting the intensity distribution of the surrounding pixel signals with a function.

A third exemplary embodiment of the disclosure will be described below. An imaging apparatus according to the present exemplary embodiment has a characteristic in the sensitivities of the pixels 111R, 111G, and 111B in the wavelength range of near-infrared light. A configuration employed in the present exemplary embodiment is particularly effective in a case where a solid-state imaging element has a pixel array similar to the Bayer array illustrated in FIGS. 2A to 2C.

In the solid-state imaging element 103 according to the present exemplary embodiment, the sensitivity of the pixel 111R and the sensitivity of the pixel 111B in the wavelength range of near-infrared light are substantially equal. Here, being "substantially equal" includes a case where the sensitivity of the pixel 111R and the sensitivity of the pixel 111B are different to the extent that the sensitivity difference is not visible. Specifically, the ratio of the sensitivity of the pixel 111R to the sensitivity of the pixel 111B may be $\frac{1}{2}^{1/2}$ or more and $2^{1/2}$ or less. As described above, the sensitivities of the pixel 111B are not necessarily equal to the sensitivities of the pixel 111R in all the wavelengths in the wavelength range of near-infrared light, and only the integral values of the sensitivities in the wavelength range of light passing through the visible light cut filter 109 may be equal.

Such a configuration described above reduces the sampling pitch of each of images varying in sensitivity that is acquired in the first image capturing mode (FIGS. 10A and 10B). As a result, it is possible to generate an image of a high resolution, while expanding a dynamic range by easy image processing. Specifically, if an image formed of the pixel signal 120R and the pixel signal 120B and an image formed of the pixel signal 120G are separately subjected to interpolation processing with a method such as a bi-liner method or a bi-cubic method, a high resolution image can be obtained. Further, if an image with middle sensitivity is used as a guide image as in the second exemplary embodiment, a false signal is less likely to be included in a post-demosaicing image, and thus image quality improves. However, adopting the configuration of the present exemplary embodiment makes the demosaic process easier.

The sensitivity of the pixel 111R (111B) in the wavelength range of near-infrared light may be higher or may be lower than the sensitivity of the pixel 111G. However, as described above, in a case where the transmission wavelength in the wavelength range of visible light and the wavelength of near-infrared light are close to each other, it is difficult to reduce the transmittance in the wavelength range of near-infrared light, without reducing the transmittance in the wavelength range of visible light. Therefore, in one embodiment, the sensitivity of each of the pixel 111R and the pixel 111B is higher than the sensitivity of the pixel 111G. Further, to control the sensitivity of the pixel, as described above, the density of the pigment contained in each of the color filters 113 may be varied, or the filter may be provided with the double-layer configuration. Alternatively, the transmission wavelength range of the visible light cut filter 109 may be controlled.

A fourth exemplary embodiment of the disclosure will be described below. The solid-state imaging element 103 of the present exemplary embodiment controls the photoelectric collection rate of the photoelectric conversion unit 115, by varying the configurations of the photoelectric conversion units 115 among the pixels 111R, 111G, and 111B. As described above, the sensitivity of a pixel is determined by the product of the transmittance of the color filter of each pixel and the photoelectron collection rate of the photoelectric conversion unit. Therefore, it is possible to control the sensitivity of the pixel in the wavelength range of near-infrared light, by varying the configurations of the photoelectric conversion units among the pixels.

Figure 11:
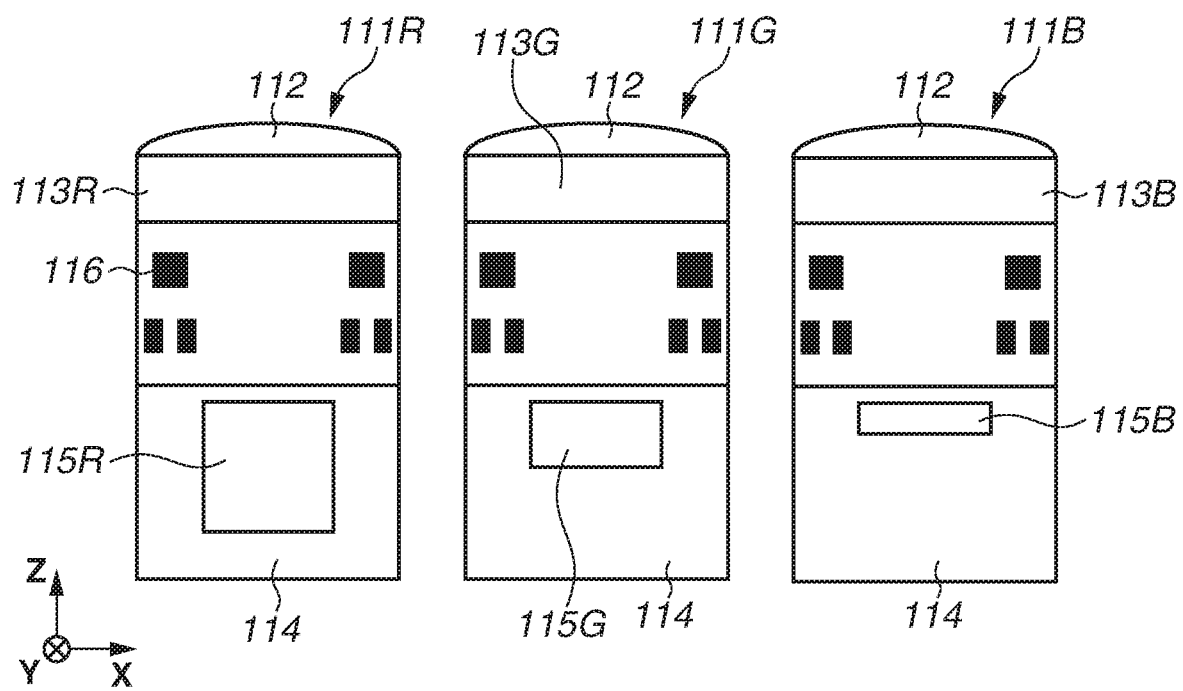
FIG. 11 is a diagram illustrating a structure example of a solid-state imaging element according to a fourth exemplary embodiment.

FIG. 11 illustrates a configuration example of the pixels 111R, 111G, and 111B in the solid-state imaging element 103 of the present exemplary embodiment. As illustrated in FIG. 11, for a photoelectric conversion unit 115R in the pixel 111R, a photoelectric conversion unit 115G in the pixel 111G, and a photoelectric conversion unit 115B in the pixel 111B, the thicknesses of the photoelectric conversion units 115 satisfy the magnitude relationship of R>G>B.

<Thickness of Photoelectric Conversion Unit>

Photoelectrons photoelectrically converted at a deep position of the substrate 114 can also be collected when the photoelectric conversion unit 115 is thicker. Thus if the thickness is larger, the photoelectron collection rate of the photoelectric conversion unit is higher. Therefore, providing the configuration illustrated in FIG. 11 allows the sensitivities 118 to satisfy the magnitude relationship of R>G>B in the wavelength range of near-infrared light. To control the thickness of the photoelectric conversion unit 115, a condition for ion implantation in forming the photoelectric conversion unit 115, specifically, an accelerating voltage, may be controlled.

<Magnitude Relationship Between Wavelengths>

As described above, the magnitude relationship between the sensitivity 118R, the sensitivity 118G, and the sensitivity 118B may not necessarily satisfy the magnitude relationship of R>G>B. However, in a case where the thicknesses of the photoelectric conversion units 115 satisfy the magnitude relationship of R>G>B, the image quality of the captured image only with visible light to be acquired in the second image capturing mode can also be improved. The reason for this will be described below.

In general, a semiconductor material such as silicon for forming a substrate of a solid-state imaging element has a larger light absorption coefficient for a shorter wavelength. Therefore, most of blue light having a relatively short wavelength is photoelectrically converted at a shallow position of the substrate. In contrast, a part of red light having a relatively long wavelength is photoelectrically converted upon arriving at a deep position of the substrate. Therefore, in the pixel 111B for blue color, only electric charge photoelectrically converted at a shallow position of the substrate may be collected in the photoelectric conversion unit 115B, and thus the photoelectric conversion unit 115B may be thin. On the other hand, in the pixel 111R for red color, in one embodiment, the photoelectric conversion unit 115R is thick so that electric charge photoelectrically converted at a deep position of the substrate can also be efficiently collected. The reason for this is as follows. After entering the pixel 111R for red color, some electric charge is photoelectrically converted at a deep position of the substrate, but is not collected in the photoelectric conversion unit 115R. This electric charge diffuses to reach an adjacent pixel, thereby causing crosstalk. In other words, it is possible to improve the color reproducibility of the image only with visible light to be acquired in the second image capturing mode, by allowing the thicknesses of the photoelectric conversion units 115 to have the magnitude relationship of R>G>B.

Further, at this time, yet in another embodiment, the transmittances in the wavelength range of near-infrared light of the color filters 113R, 113G, and 113B also have the magnitude relationship of R>G>B. The reason for this will be described below.

When the transmittance of the color filter is higher, the amount of light entering the photoelectric conversion unit in the pixel is larger. In a case where the amount of light entering the photoelectric conversion unit is large, electric charge not collected in the photoelectric conversion unit diffuses to reach an adjacent pixel, if the photoelectric collection rate of the photoelectric conversion unit is low. In particular, in a case where the amount of light entering the photoelectric conversion unit of an adjacent pixel is small, the influence of crosstalk is strong. Therefore, in a pixel that is adjacent to a pixel receiving a small amount of light entering the photoelectric conversion unit and receiving a large amount of light entering the photoelectric conversion unit, the photoelectric collection rate of the photoelectric conversion unit may be high. On the other hand, in a case where the amount of light entering the photoelectric conversion unit is small, even if the photoelectric collection rate of the photoelectric conversion unit is low, the amount of electric charge diffusing to reach an adjacent pixel is small. In particular, in a case where the amount of light entering the photoelectric conversion unit of an adjacent pixel is larger, the influence of crosstalk is smaller. Therefore, in a pixel that is adjacent to a pixel having a large amount of light entering the photoelectric conversion unit and having a small amount of light entering the photoelectric conversion unit, the photoelectron collection rate of the photoelectric conversion unit may be low.

As described above, according to the fourth exemplary embodiment, a configuration is provided such that the larger the amount of light entering the photoelectric conversion unit is, the higher the photoelectron collection rate of the photoelectric conversion unit is. In other words, the transmittances in the wavelength range of near-infrared light of the color filters 113 have the magnitude relationship of R>G>B, and the thicknesses of the photoelectric conversion units 115 have the magnitude relationship of R>G>B.

A fifth exemplary embodiment of the disclosure will be described below. The solid-state imaging element 103 of the present exemplary embodiment has a characteristic in a method for reading out a pixel signal in the first image capturing mode. The method for reading out the signal of the present exemplary embodiment is particularly effective in a case where the solid-state imaging element has a pixel array similar to the Bayer array illustrated in FIG. 2A, and the sensitivities 118 in the wavelength range of near-infrared light have a magnitude relationship of R>G>B similar to the magnitude relationship illustrated in FIGS. 3A and 3B.

Figure 12A:
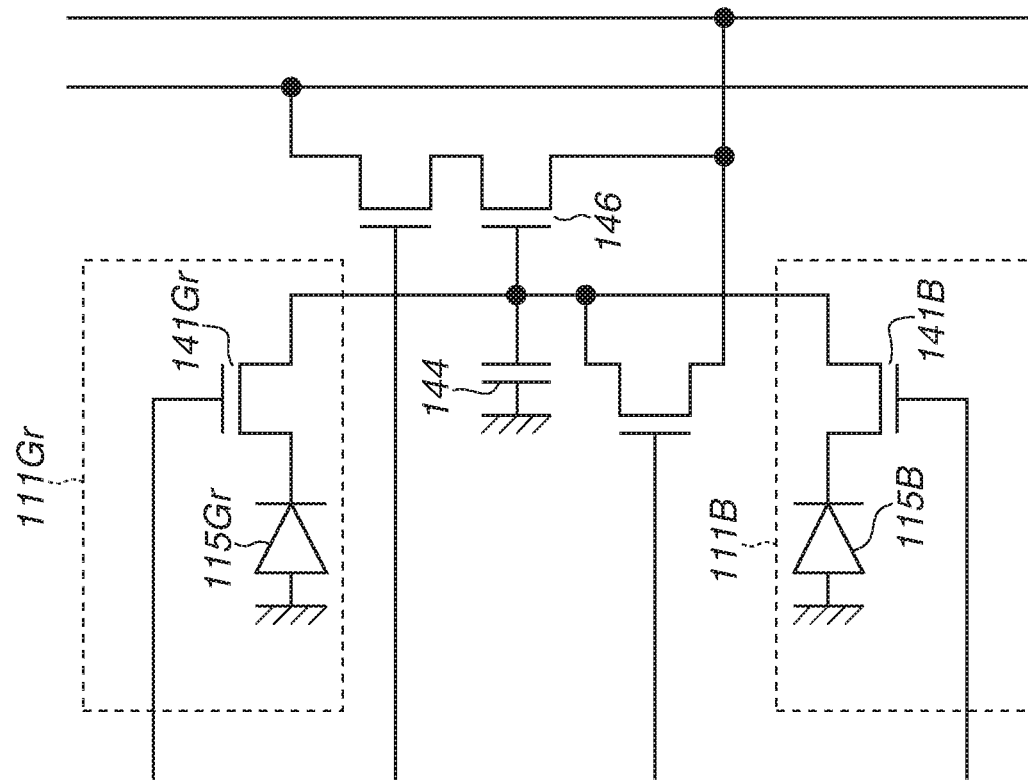
FIGS. 12A and 12B are diagrams each illustrating a partial circuit of a solid-state imaging element according to a fifth exemplary embodiment.
Figure 12B:
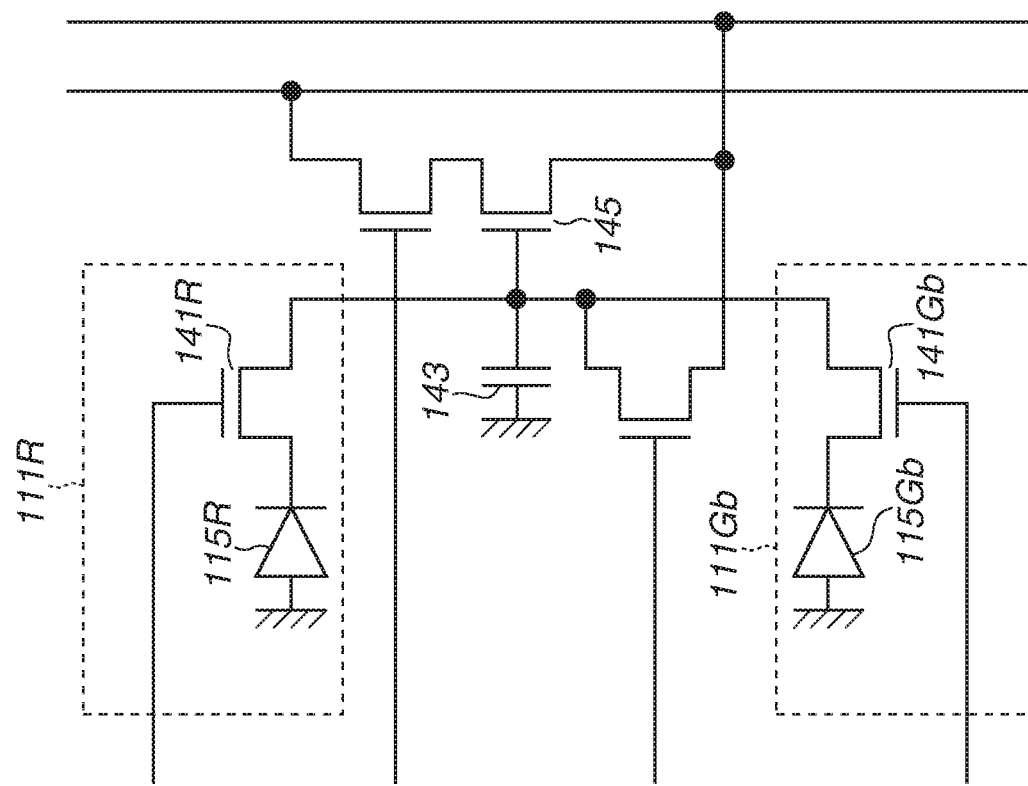

FIGS. 12A and 12B each illustrate a partial circuit diagram of the solid-state imaging element 103 of the fifth exemplary embodiment. FIG. 12A illustrates a circuit diagram of a part where the pixel 111R for red color and the pixel 111Gb for green color are adjacent to each other. FIG. 12B illustrates a circuit diagram of a part where the pixel 111Gr for green color and the pixel 111B for blue color are adjacent to each other. The solid-state imaging element illustrated in each of FIGS. 12A and 12B has a configuration in which two pixels adjacent to each other in a Y direction share a readout circuit. In other words, there is provided such a configuration that both of electric charge accumulated in the pixel 111R for red color and electric charge accumulated in the pixel 111Gb for green color can be transferred to an intra-pixel memory 143. Similarly, both of electric charge accumulated in the pixel 111Gr for green color and electric charge accumulated in the pixel 111B for blue color can be transferred to an intra-pixel memory 144. The electric charge transferred to the intra-pixel memory 143 and the electric charge transferred to the intra-pixel memory 144 are converted into voltage signals by a source follower 145 and a source follower 146, respectively, and then read out to a peripheral circuit. In this way, the plurality of pixels shares the readout circuit, and thereby the number of necessary transistors per pixel can be reduced. As a result, the aperture ratio of the photoelectric conversion unit can be increased, which improves the sensitivity.

<Addition Readout>

In the imaging apparatus 100 of the present exemplary embodiment, when a pixel signal is read out from the solid-state imaging element, the control unit 104 performs addition readout by using the shared intra-pixel memory, in the first image capturing mode. Performing the addition readout can omit electric charge reset and readout operation for the photoelectric conversion unit once, thereby allowing fast acquisition of a captured image.

Specifically, the following readout is performed. First, the control unit 104 turns on a transfer transistor 141Gb (141B), and thereby transfers electric charge accumulated in the photoelectric conversion unit 115Gb (115B) of a pixel with relatively low sensitivity, to the intra-pixel memory 143 (144). The control unit 104 then reads out a first pixel signal based on the electric charge accumulated in the photoelectric conversion unit 115Gb (115B), by using the source follower 145 (146).

Next, the control unit 104 turns on a transfer transistor 141R (141Gr) while holding the electric charge in the intra-pixel memory 143 (144), and thereby transfers electric charge accumulated in the photoelectric conversion unit 115R (115Gr) of a pixel with relatively high sensitivity, to the intra-pixel memory 143 (144). The control unit 104 then reads out a second pixel signal based on the sum of the electric charge accumulated in the photoelectric conversion unit 115Gb (115B) and the electric charge accumulated in the photoelectric conversion unit 115R (115Gr), by using the source follower 145 (146). Finally, the control unit 104 subtracts the first pixel signal from the second pixel signal, thereby determining a third pixel signal, which corresponds to a signal based on the electric charge accumulated in the photoelectric conversion unit 115R (115Gr) of the pixel with relatively high sensitivity.

In this process, publicly known noise-reduction operation such as correlated double sampling may be performed to remove kTC noise generated at the time of resetting each of the intra-pixel memories 143 and 144. To be more specific, before transferring the electric charge accumulated in the photoelectric conversion unit 115, a reset level signal may be output from each of the source followers 145 and 146 and then stored. In the subsequent operation, each of the pixel signals may be determined by subtracting the reset level from the read-out signal.

<Effects of Addition Readout>

Here, noise generated in a pixel signal of the solid-state imaging element will be described. Except for a fixed pattern noise removable by correlated double sampling (CDS), dominant noise includes light shot noise $N_s$ and readout noise $N_r$. The light shot noise $N_s$ occurs during the photoelectric conversion, and the size of this noise depends on the magnitude of a signal. The light shot noise $N_s$ is the square root of a signal amount ($N_s=S^{1/2}$), where S is a signal component in a pixel signal. On the other hand, the readout noise $N_r$ occurs when a signal is read out from the source follower, and the size of this noise takes a constant value without depending on the magnitude of the signal. Because the light shot noise and the readout noise are independent events, the combined value of the noise is a square-root of sum of squares value. In other words, the SN ratio of the first pixel signal is calculated by the following formula (4).

$$SN_1=S_1/(S_1+N_r^2)^{1/2} \quad (4)$$

Similarly, the SN ratio of the second pixel signal is calculated by the following formula (5).

$$SN_2=S_2/(S_2+N_r^2)^{1/2} \quad (5)$$

The third pixel signal is determined by subtracting the first pixel signal from the second pixel signal. A signal component in the third pixel signal is the difference between a signal component in the second pixel signal and a signal component in the first signal component. The readout noise occurs independently at each of the time when the first pixel signal is output and the time when the second pixel signal is output, and thus is a root-sum-square value. On the other hand, a light shot noise component in the second pixel signal is determined by adding a light shot noise component of signal charge transferred to the intra-pixel memory later, to a light shot noise component in the first pixel signal. Therefore, a light shot noise component in the third pixel signal is the square root of the difference between the signal component in the second pixel signal and the signal component in the first signal component. In light of the foregoing, the SN ratio of the third pixel signal is calculated by the following formula (6).

$$SN_3=(S_2-S_1)/(S_2-S_1+2N_r^2)^{1/2} \quad (6)$$

When the formulas (4) and (6) are compared with each other, it is apparent that the photoelectric conversion unit that transfers the electric charge to the intra-pixel memory earlier can output the pixel signal with an improved SN ratio, as compared with the photoelectric conversion unit that transfers the electric charge to the intra-pixel memory later. In a case where the amount of electric charge is sufficiently large, the light shot noise is dominant with respect to the readout noise ($S>>N_r^2$). Therefore, the difference between the SN ratio of the first pixel signal and the SN ratio of the third pixel signal is small. However, in a case where the amount of electric charge is small, the influence of the readout noise is relatively large ($S<N_r^2$), and thus leads to a significant degradation in signal quality. The degradation in signal quality results in a decline in the quality of a captured image when the pixel signal read out later is used.

In the present exemplary embodiment, the pixel signal based on the electric charge accumulated in the photoelectric conversion unit 115Gb (115B) in the pixel with relatively low sensitivity is read out earlier than the pixel signal based on the electric charge accumulated in the photoelectric conversion unit 115R (115Gr) in the pixel with relatively high sensitivity. Therefore, it is possible to achieve fast acquisition of a captured image, while suppressing the degradation in signal quality due to the addition readout.

<Readout in Captured Image Acquisition Mode for Visible Light>

In the second image capturing mode for acquiring the captured image with visible light in one embodiment, each pixel signal is read out independently, without using the addition readout. This is because, in a case where the captured image with visible light is acquired, the mount of light entering the photoelectric conversion unit in each pixel varies depending on the color of an object, and it is therefore difficult to read out a signal of a small amount of electric charge earlier without depending on the object.

Further, in a case where the addition readout is performed in the second image capturing mode, the color reproducibility of the captured image can decline for the following reason. The photoelectric conversion unit 115R (115Gr) and the photoelectric conversion unit 115Gb (115B) sharing the intra-pixel memory 143 (144) acquire pixel signals of different colors. Therefore, if a failure occurs in charge transfer due to manufacturing variations in transistors, the pixel signals of different colors are mixed even if the failure is not serious.

As described above, the pixel signal of the pixel with relatively low sensitivity is read out earlier in the first image capturing mode, and each pixel signal is independently read out in the second image capturing mode. In a case where each pixel signal is independently read out, the intra-pixel memory is reset once, after the electric charge of the photoelectric conversion unit is transferred to the intra-pixel memory and then read out by the source follower. Afterward, the electric charge of the photoelectric conversion unit of another pixel may be transferred to the intra-pixel memory and then read out.

The example illustrated in FIGS. 12A and 12B adopts the configuration in which the two pixels adjacent to each other in the Y direction share the readout circuit. However, two pixels adjacent to each other in the X direction may share the readout circuit, or four pixels adjacent to each other in the X and Y directions may share the readout circuit. In a case where the two pixels adjacent to each other in the X direction share the readout circuit, the pixel signals of the pixel 111Gr for green color and the pixel 111B for blue color are transferred earlier, in the first image capturing mode. The pixel signals of the pixel 111R for red color and the pixel 111Gb for green color are transferred later. The addition readout may be performed afterward. In a case where the four pixels adjacent to each other in the X and Y directions share the readout circuit, the pixel signal of the pixel 111B for blue color is transferred first, and the pixel signals of the pixels 111Gr and 111Gb for green color are subsequently transferred, in the first image capturing mode. The signal of the pixel 111R for red color is transferred last. The addition readout may be performed afterward.

<Sharing with Adjacent Pixels>

Pixels that are not adjacent to each other may share the readout circuit. However, sharing the readout circuit with the adjacent pixels simplifies a wiring line layout.

Other Embodiments

Embodiments of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-232848, filed Dec. 4, 2017, which is hereby incorporated by reference herein in its entirety.

What is claimed is:

1. An apparatus comprising:
    a solid-state imaging element including a first pixel and a second pixel, the first pixel being higher in sensitivity than the second pixel in a first wavelength range of visible light, the second pixel being higher in sensitivity than the first pixel in a second wavelength range of visible light, and the first pixel being higher in sensitivity than the second pixel in a wavelength range of near-infrared light;
    a first cut filter provided on a light entry side of the solid-state imaging element and configured to cut visible light; and
    at least one processor or circuit configured to generate an image from pixel signals acquired by the solid-state imaging element,
    wherein in a case where an intensity of a pixel signal acquired by the first pixel is less than a predetermined threshold, the at least one processor or circuit uses the pixel signal acquired by the first pixel, and in a case where an intensity of a pixel signal acquired by the first pixel is greater than or equal to the predetermined threshold, the at least one processor or circuit uses a pixel signal acquired by the second pixel, and wherein the solid-state imaging element further includes a third pixel, the first pixel being higher in sensitivity than the third pixel in a first wavelength range of visible light, the second pixel being higher in sensitivity than the third pixel in a second wavelength range of visible light, the third pixel being higher in sensitivity than each of the first pixel and the second pixel in a third wavelength range between the first wavelength range and the second wavelength range, and the first pixel being higher in sensitivity than the third pixel and the third pixel being higher in sensitivity than the second pixel in a wavelength range of near-infrared light.

2. The apparatus according to claim 1, wherein in a case where an intensity of a pixel signal acquired by the first pixel is less than a predetermined threshold, the at least one processor or circuit uses the pixel signal acquired by the first pixel, wherein in a case where an intensity of a pixel signal acquired by the first pixel is equal to or more than the predetermined threshold and an intensity of a pixel signal acquired by the third pixel is less than the predetermined threshold, the at least one processor or circuit uses the pixel signal acquired by the third pixel, and wherein in a case where an intensity of a pixel signal acquired by the third pixel is equal to or more than the predetermined threshold, the at least one processor or circuit uses a pixel signal acquired by the second pixel.

3. The apparatus according to claim 2, wherein a ratio of a product of a sensitivity of the first pixel and a sensitivity of the second pixel in the wavelength range of near-infrared light to a square of a sensitivity of the third pixel is approximately 0.1 or more and approximately 10 or less.

4. The apparatus according to claim 1, wherein the third pixel includes a plurality of types of pixel varying in sensitivity in the wavelength range of near-infrared light.

5. The apparatus according to claim 1, wherein the first pixel is a red pixel, the second pixel is a blue pixel, the third pixel is a green pixel, and the solid-state imaging element has a Bayer array.

6. The apparatus according to claim 5, wherein the at least one processor or circuit subjects a demosaic process using a pixel signal acquired by the third pixel to a pixel signal acquired by the first pixel, subjects a demosaic process using a pixel signal acquired by the third pixel to a pixel signal acquired by the second pixel, and generates an image by switching from the pixel signal subjected to the demosaic process to a pixel signal to be used, according to brightness of an object, by utilizing a difference between sensitivities in the wavelength range of near-infrared light.

7. The apparatus according to claim 1, wherein a ratio of a sensitivity of the first pixel to a sensitivity of the second pixel in the wavelength range of near-infrared light is approximately $\frac{1}{2}^{1/2}$ or more and approximately $2^{1/2}$ or less.

8. A method for an apparatus having a solid-state imaging element including a first pixel and a second pixel, the first pixel being higher in sensitivity than the second pixel in a first wavelength range of visible light, the second pixel being higher in sensitivity than the first pixel in a second wavelength range of visible light, and the first pixel being higher in sensitivity than the second pixel in a wavelength range of near-infrared light, and a first cut filter provided on a light entry side of the solid-state imaging element and configured to cut visible light, the method comprising:

generating an image from a pixel signal acquired by the solid-state imaging element, wherein in a case where an intensity of a pixel signal acquired by the first pixel is less than a predetermined threshold, the pixel signal acquired by the first pixel is used, and in a case where an intensity of a pixel signal acquired by the first pixel is greater than or equal to the predetermined threshold, a pixel signal acquired by the second pixel is used; and wherein the solid-state imaging element further includes a third pixel, the first pixel being higher in sensitivity than the third pixel in a first wavelength range of visible light, the second pixel being higher in sensitivity than the third pixel in a second wavelength range of visible light, the third pixel being higher in sensitivity than each of the first pixel and the second pixel in a third wavelength range that is between the first wavelength range and the second wavelength range, and the first pixel being higher in sensitivity than the third pixel and the third pixel being higher in sensitivity than the second pixel in a wavelength range of near-infrared light.

9. The non-transitory computer-readable storage medium storing a program for controlling an apparatus comprising a solid-state imaging element including a first pixel and a second pixel, the first pixel being higher in sensitivity than the second pixel in a first wavelength range of visible light, the second pixel being higher in sensitivity than the first pixel in a second wavelength range of visible light, and the first pixel being higher in sensitivity than the second pixel in a wavelength range of near-infrared light, and a first cut filter provided on a light entry side of the solid-state imaging element and configured to cut visible light, the program causing a computer to execute:

generating an image from a pixel signal acquired by the solid-state imaging element, wherein in a case where an intensity of a pixel signal acquired by the first pixel is less than a predetermined threshold, the pixel signal acquired by the first pixel is used, and in a case where an intensity of a pixel signal acquired by the first pixel is greater than or equal to the predetermined threshold, a pixel signal acquired by the second pixel is used, and wherein the solid-state imaging element further includes a third pixel, the first pixel being higher in sensitivity than the third pixel in a first wavelength range of visible light, the second pixel being higher in sensitivity than the third pixel in a second wavelength range of visible light, the third pixel being higher in sensitivity than each of the first pixel and the second pixel in a third wavelength range between the first wavelength range and the second wavelength range, and the first pixel being higher in sensitivity than the third pixel and the third pixel being higher in sensitivity than the second pixel in a wavelength range of near-infrared light.

10. The method according to claim 8, wherein in a case where an intensity of a pixel signal acquired by the first pixel is less than a predetermined threshold, the pixel signal acquired by the first pixel is used, wherein in a case where an intensity of a pixel signal acquired by the first pixel is equal to or more than the predetermined threshold and an intensity of a pixel signal acquired by the third pixel is less than the predetermined threshold, the pixel signal acquired by the third pixel is used, and wherein in a case where an intensity of a pixel signal acquired by the third pixel is equal to or more than the predetermined threshold, the pixel signal acquired by the second pixel is used.

11. The method according to claim 8, wherein the third pixel includes a plurality of types of pixel varying in sensitivity in the wavelength range of near-infrared light.

12. The method according to claim 8, wherein the first pixel is a red pixel, the second pixel is a blue pixel, the third pixel is a green pixel, and the solid-state imaging element has a Bayer array.

13. The method according to claim 8, wherein a ratio of a sensitivity of the first pixel to a sensitivity of the second pixel in the wavelength range of near-infrared light is approximately $½^{1/2}$ or more and approximately $2^{1/2}$ or less.

14. The non-transitory computer-readable storage medium according to claim 9, wherein in a case where an intensity of a pixel signal acquired by the first pixel is less than a predetermined threshold, the pixel signal acquired by the first pixel is used, wherein in a case where an intensity of a pixel signal acquired by the first pixel is equal to or more than the predetermined threshold and an intensity of a pixel signal acquired by the third pixel is less than the predetermined threshold, the pixel signal acquired by the third pixel is used, and wherein in a case where an intensity of a pixel signal acquired by the third pixel is equal to or more than the predetermined threshold, the pixel signal acquired by the second pixel is used.

15. The non-transitory computer-readable storage medium according to claim 9, wherein the third pixel includes a plurality of types of pixel varying in sensitivity in the wavelength range of near-infrared light.

16. The non-transitory computer-readable storage medium according to claim 9, wherein the first pixel is a red pixel, the second pixel is a blue pixel, the third pixel is a green pixel, and the solid-state imaging element has a Bayer array.

17. The non-transitory computer-readable storage medium according to claim 9, wherein a ratio of a sensitivity of the first pixel to a sensitivity of the second pixel in the wavelength range of near-infrared light is approximately $½^{1/2}$ or more and approximately $2^{1/2}$ or less.

* * * * *